(12) United States Patent
Matsumoto et al.

(10) Patent No.: US 7,466,554 B2
(45) Date of Patent: Dec. 16, 2008

(54) PIVOTAL MOUNTING STRUCTURE FOR AN ELECTRONIC DEVICE

(75) Inventors: Sinichi Matsumoto, Hamamatsu (JP); Shigeru Sawada, Hamamatsu (JP)

(73) Assignee: Roland Corporation, Hamamatsu (JP)

( * ) Notice: Subject to any disclaimer, the term of this patent is extended or adjusted under 35 U.S.C. 154(b) by 484 days.

(21) Appl. No.: 11/237,408

(22) Filed: Sep. 27, 2005

(65) Prior Publication Data

US 2006/0133050 A1   Jun. 22, 2006

(30) Foreign Application Priority Data

Dec. 22, 2004   (JP) ............................. 2004-370741

(51) Int. Cl.
*H05K 5/00* (2006.01)
(52) U.S. Cl. .................. 361/724; 361/755; 248/292.13; 248/292.14
(58) Field of Classification Search ................. 361/724, 361/755; 248/292.13, 292.14
See application file for complete search history.

(56) References Cited

U.S. PATENT DOCUMENTS 5,762,412 A * 6/1998 Kim ........................ 312/319.2
5,941,497 A * 8/1999 Inoue et al. .................. 248/514
6,411,502 B1 * 6/2002 Burrell ........................ 361/681
6,754,070 B2 * 6/2004 Chen ........................... 361/683
7,337,450 B2 * 2/2008 Sato et al. .................... 720/647

\* cited by examiner

*Primary Examiner*—Lisa Lea-Edmonds
*Assistant Examiner*—Ingrid Wright
(74) *Attorney, Agent, or Firm*—Foley & Lardner LLP

(57) ABSTRACT

A pivotal mounting structure for an electronic device, an electronic device utilizing the pivotal mounting structure, and a method of mounting an electronic device on a rack. The pivotal mounting structure allows an electronic device to be mounted in a rack, and allows the electronic device to pivot up so that the front operating panel can be set at an angel with respect to the rack. The structure comprises a angle member, a side plate, a pivot shaft, a holding section, and a support device. The side plate is attached to the electronic device, and the angle member is attached to the rack. The pivot shaft allows rotation between the angle member and the side plate. The holding section and the supporting device allows the angle between the angle plate and side plate to be maintained at specific angles.

24 Claims, 6 Drawing Sheets

PIVOTAL MOUNTING STRUCTURE FOR AN ELECTRONIC DEVICE

CROSS-REFERENCE TO RELATED PATENT APPLICATIONS

This application claims priority to Japanese patent application No. 2004-370741 (filed on Dec. 22, 2004 in Japan), which was assigned to the applicants and is incorporated herein.

BACKGROUND OF THE INVENTION

The present invention relates generally to a pivotal mounting structure for an electronic device, an electronic device that can be mounted in a rack using the pivotal mounting structure or placed on a table-top, and a method of mounting an electronic device on a rack.

For some time, when several electronic devices are used mutually interconnected or simultaneously, it is common to mount the electronic devices in a rack, which saves space and improves work efficiency. In addition, since a majority of the complicated wiring between the electronic devices is behind the rack and not visible from the front, the aesthetic appearance and the safety of the work environment is improved.

Many electronic devices such as audio and video equipments are used for long periods of time in a specified location without moving, hence they are often mounted in a rack. They are usually set-up to make operation by the user easier, with the operating panel containing the operators and the display positioned on the front surface of the main body of the electronic device ("main body"), and the input and output terminals positioned on the back surface of the main body.

Among the electronic devices, there are those that may be used while installed in a rack ("rack mounted") or placed on a table-top ("stand-alone"). This kind of electronic device includes sound source modules and the like.

Sound source modules are electronic devices that are used for operations such as sound production for recording. The sound source module takes in from a keyboard or a sequencer an input signal, which indicates the pitch, timbre, volume, or other aspects of a musical tone, and forms and outputs a musical tone that corresponds to the input signal. An equalizer that changes the frequency of the musical tone or an effector that applies effects may also be installed. Incidentally, various operators for adjusting the volume and timbre of the musical tone are attached to the operating panel positioned on the front surface of the main body. The operating panel may also comprise a liquid crystal display that displays each of the parameters that have been set.

A mixer, which is also an example of an electronic device that can be used rack mounted or stand-alone, is disclosed in the Patent References.

SUMMARY OF THE INVENTION

In those cases when an electronic device is installed in a rack, the operating panel is aligned vertically with the front surface of the rack. If the height of the electronic device on the rack is set approximately at the eye-level of the user, the operators on the operating panel are easy to operate and the display screen is easy to see. However, in those cases when the electronic device is set on the lower part of the rack away from the user's line of sight, the operation of the operators and the viewing of the display screen become more difficult, thus the work efficiency is degraded.

In particular, in those cases when the display screen is a liquid crystal display, visual verification of the display is not possible unless the liquid crystal screen is viewed from a direction that is nearly perpendicular to the screen.

Therefore, when the electronic device is installed in a rack, it is preferable to set the operating panel slanted at a desired angle. However, if the operating panel is made moveable with respect to the main body, there are problems associated with the complicated structural design and high manufacturing cost.

The present invention resolves the problems described above by providing an electronic device structure that can accommodate operation as both a stand alone device and a rack-mounted device, and provides satisfactory working efficiency under both setting conditions without the cost becoming too high.

In order to achieve this object, the electronic device in the first preferred embodiment is an electronic device that can be mounted in a rack and comprises an operating panel, a pivot shaft on a side surface of a main body, a support device that supports the electronic device at a specified pivoting position, and an angle member. In this embodiment, the operating panel is positioned on the front surface of the main body of the electronic device, comprises a plurality of operators, and is perpendicular to the side surface of the main body. Furthermore, the angle member comprises a rack fastening section fastened to the rack, a pivot shaft fastening section fastened to the pivot shaft, and a holding section that supports the support device.

In an electronic device of a second preferred embodiment of the present invention, the pivot shaft of the first embodiment is positioned in the vicinity of the upper part of the operating panel.

In an electronic device of a third preferred embodiment of the present invention, the support device of the first or second embodiment further comprises a fastening portion that fastens in three or more pivot positions.

In a fourth preferred embodiment of the present invention, the electronic device of the third embodiment is one wherein the support device further comprises a ball plunger, and the holding section comprises a plurality of support holes that are formed on the angle member along an arc of a circle with the pivot shaft as center of the circle.

In a fifth preferred embodiment of the present invention, the main body of the electronic device of the first embodiment is shaped like a pentagonal prism in which side plates of the main body are in a pentagon-shape.

In a sixth preferred embodiment of the present invention, the operating panel of the electronic device of the first embodiment further comprises a liquid crystal display.

By means of the electronic device in the first preferred embodiment, since the electronic device can be mounted in a rack and comprises an operating panel, a pivot shaft on the side surface of the main body, support device that supports the electronic device at a specified pivoting position, and an angle member, in those cases where the electronic device is mounted in a rack, it is possible to adjust the slant angle of the operating panel. Hence there is the advantageous result of improved work efficiency because the operators on the operating panel are easily accessible.

In addition to the advantages of the first embodiment, since the pivot shaft of electronic device in the second preferred embodiment is positioned in the vicinity of the upper part of the operating panel, when the operating panel is set at a slant, the operating panel is brought up toward the front of the rack. Therefore, there is the advantageous result that the operators on the operating panel are easily accessible. On the other hand, if the pivot shaft is positioned near the center or the lower part of the operating panel, a portion of the operating panel will protrude into the rack when the operating panel is set at a slant, hence operation of the operating panel will be more difficult than with the second embodiment of the present invention.

In addition to the advantages of the first or second preferred embodiments, since the support device of the third preferred embodiment comprises a fastening portion that fastens in three or more pivot positions, there is the advantageous result that it is possible to select the adjustable slant angle of the operating panel to an angel that makes the operation of the operators the easiest.

For the electronic device of the fourth preferred embodiment of the present invention, since the support device further comprises a ball plunger and the holding section comprises a plurality of support holes formed on an angle member along an arc of a circle with the pivot shaft as the center, there is the advantageous result that the adjustment mechanism for the slant angle of the operating panel can be manufactured at a low cost.

For the electronic device of the fifth preferred embodiment of the present invention, since the main body is shaped like a pentagonal prism in which the side plates have a pentagon shape, in those cases where the device is set in the rack with the operating panel slanted, there is the advantageous result that there is no need to have a spacer between the electronic device and the device below, or it is possible to make the spacer small.

In the sixth preferred embodiment of the present invention, since the operating panel of the electronic device comprises a liquid crystal display, there is the advantageous result that it is possible to adjust the slant angle of the operating panel to set the panel in a position for easy viewing of the display.

DETAILED DESCRIPTION OF THE PREFERRED EMBODIMENTS

Figure 1:
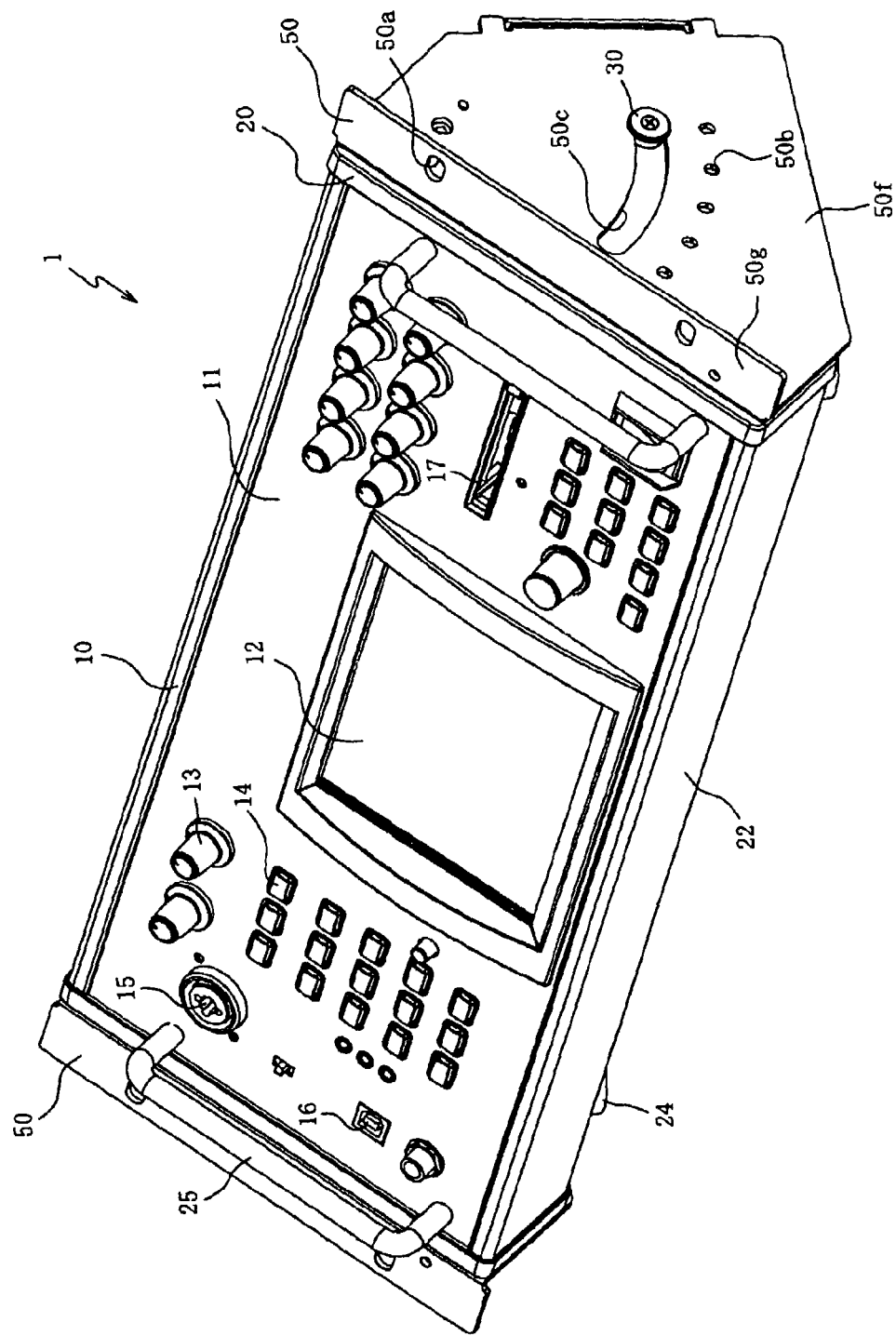
FIG. 1 is an exterior oblique view showing the exterior front surface of a sound source module in accordance with the present invention.
Figure 2:
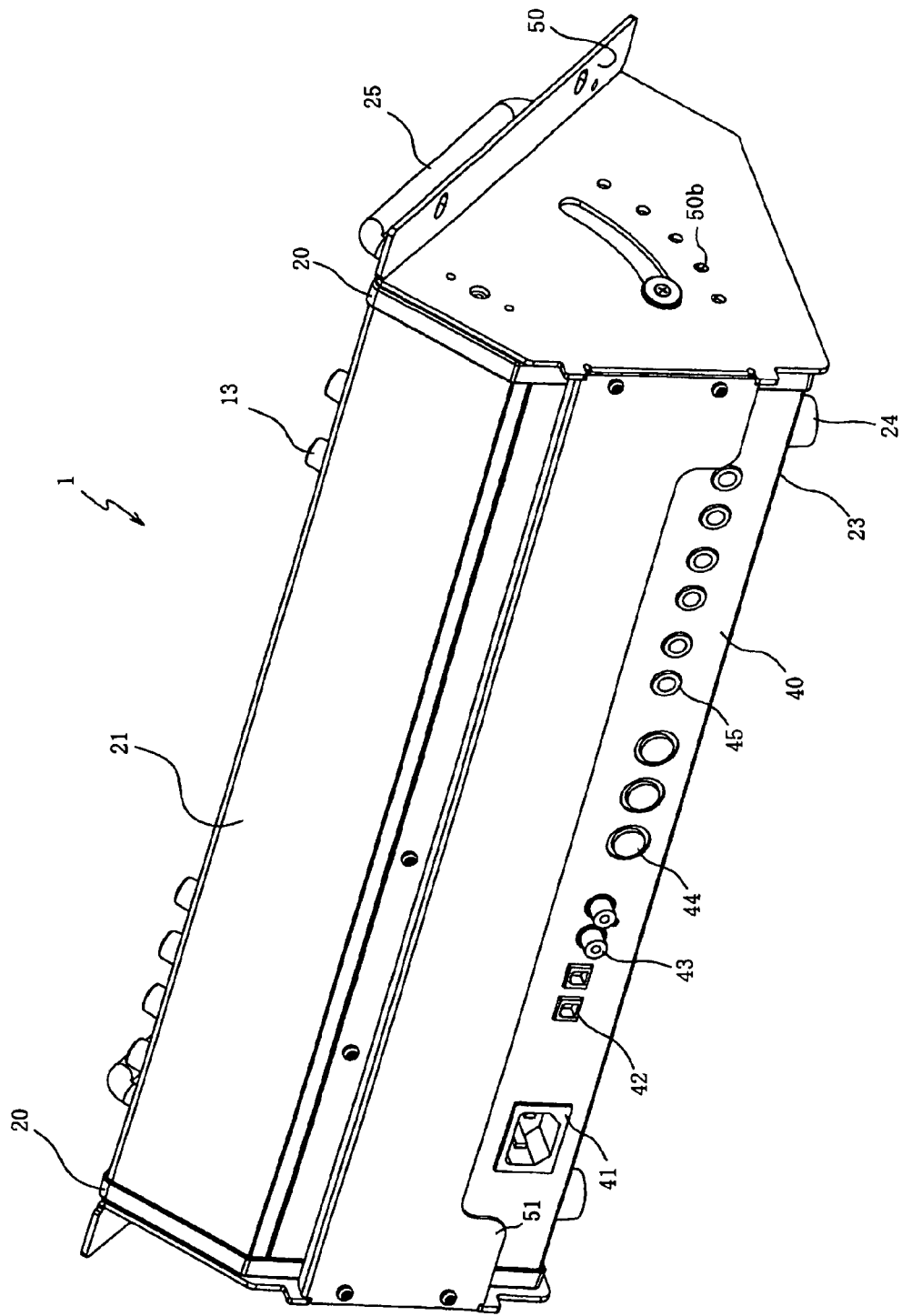
FIG. 2 is an exterior oblique view showing the exterior back surface of the sound source module.

An explanation will be given below of one preferred embodiment of the present invention while referring to the attached drawings. FIG. 1 is a front oblique view of a sound source module 1, which is one example of an electronic device in accordance with an embodiment of the present invention. FIG. 2 is a back surface oblique drawing of the module. Other embodiments of the present invention may involve different types of electronic devices.

The sound source module 1 comprises a main body 10, two side plates 20 of the main body, and a pair of angle members 50 with a peak-shaped angle section attached to the side plates 20. First, an explanation will be given regarding the main body 10. As shown in FIGS. 1 and 2, the main body 10 is in the shape of a pentagonal prism, and comprises the operating panel 11, the upper surface 21 adjoining and perpendicular to the upper edge of the operating panel, the lower surface 22 adjoining and perpendicular to the lower edge of the operating panel, the bottom surface 23 adjoining the other edge of the lower surface 22 and forming a 45 degree angle with the operating panel 11 and the lower surface 22, and the back surface 40 attached to the other edge of the upper surface 21 and forming a 45 degree angle with the upper surface. The operating panel 11, upper surface 21, lower surface 22, bottom surface 23, and back surface 40 together form the prismatic planes of the pentagonal prism shape of the main body 10.

When the bottom surface 23 is set on a table top, the operating panel 11 becomes an oblique surface and is at a 45 degree downward slant. The operating panel 11 comprises a liquid crystal display device 12, a plurality of operators such as round volume control knobs 13 and switch buttons 14, a cannon connector 15 for connection with a microphone, a USB port 16, a card slot 17 for a PC card, a power switch 18, and others switches or connectors. Other embodiments of the present invention may contain different switches and connectors.

Handles 25 that are shaped like the letter "U" are positioned on both ends of the operating panel 11 in the horizontal direction. Hence, it is possible to set the operating panel 11 at any angle desired with respect to the vertical plane by operating the handles.

Rubber feet are placed in four places (only partially shown in the drawing) on the bottom surface 23, and these rubber feet are in contact with the table-top when the device is set on a table-top.

The angle members 50 are formed from steel plates, and are attached so that it is possible for the two side plates 20 to pivot. The angle members 50 comprise side plate sections 50f that are shaped roughly the same as the two side plates 20, and front surface sections 50g that are perpendicular to the side plate sections 50f. When the sound source module 1 is attached to the rack 70 (refer to FIG. 5), five support holes 50b are mated with the balls 32a of the ball plungers 32 (refer to FIG. 3) in order to adjust the slant angle of the sound source module 1. Guide holes 50c are formed on the side plate sections 50f. Guide members 30 are inserted into guide holes 50c to prevent the opening of the angle members 50 towards the outside, since the angle members 50 are pushed by the ball plungers 32 (refer to FIG. 3). Threaded holes 50a are formed on the front surface section 50g, and are used to fasten the angle members 50 to the rack 70 with screws.

The back surface 40 comprises a power connector 41 for AC electric power connection, a USB ports 41 for USB cables, pin jacks 43 for stereo outputs, three MIDI jacks 44 for MIDI in, MIDI through, and MIDI out, and a plurality of other input or output jacks 45.

As shown in FIG. 2, the angle members 50 on the two sides are connected by a linking member 51, so that when the sound source module 1 is attached to the rack 70, the angle members 50 on the two sides are positioned mutually facing each other. Hence, when the slant angle of the sound source module 1 is changed, the angle members 50 are prevented from opening to the outside, even though they are pushed by the ball plungers 32.

Figure 3A:
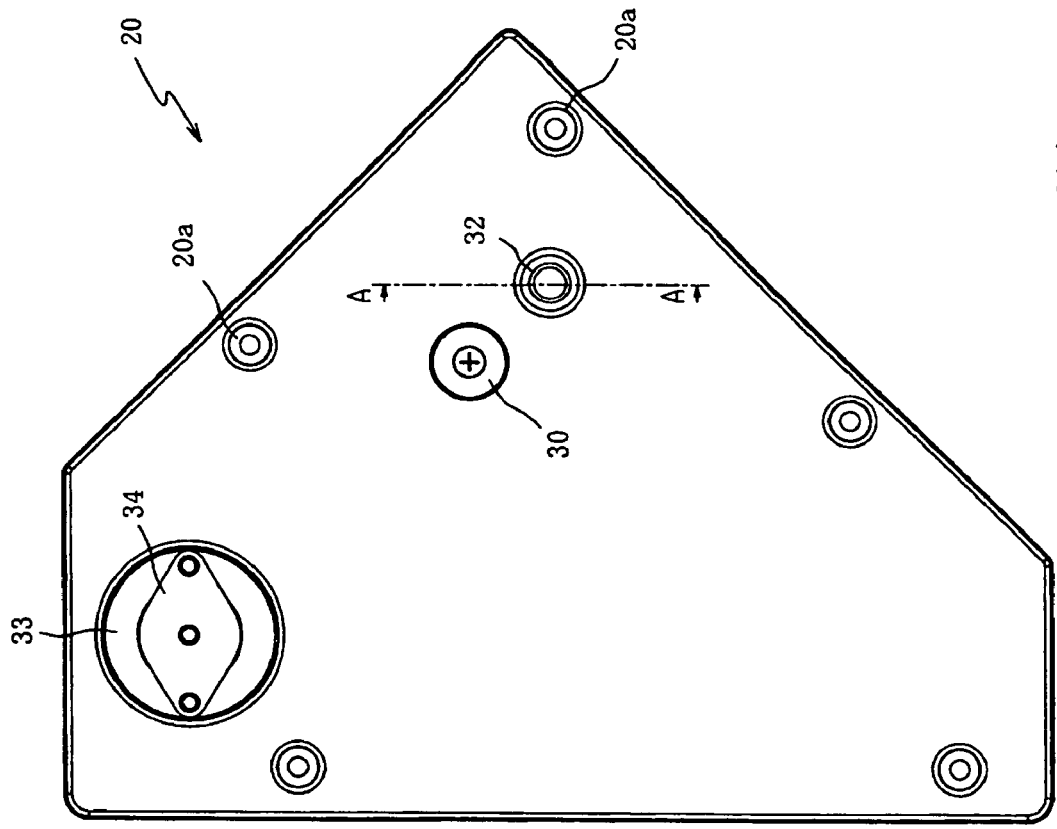
FIG. 3(a) is a front view of a side plate.

Next, a detailed explanation will be given regarding the side plates 20 and the angle members 50 while referring to FIGS. 3 and 4. FIG. 3(a) is a front drawing of a side plate 20.

Figure 3B:
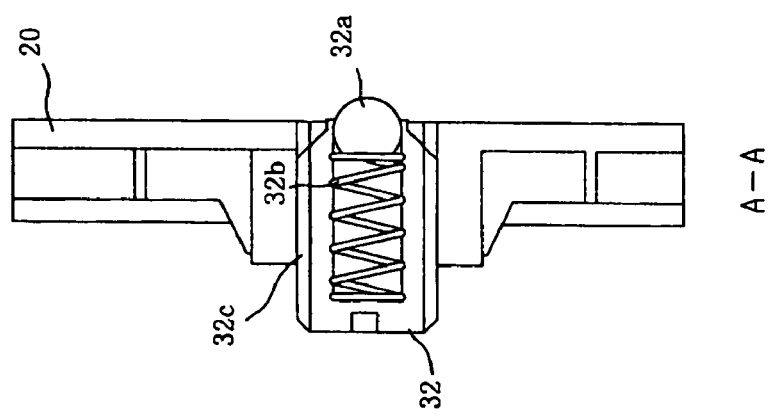
FIG. 3(b) is a cross-section view along the line A-A in FIG. 3(a)
Figure 4:
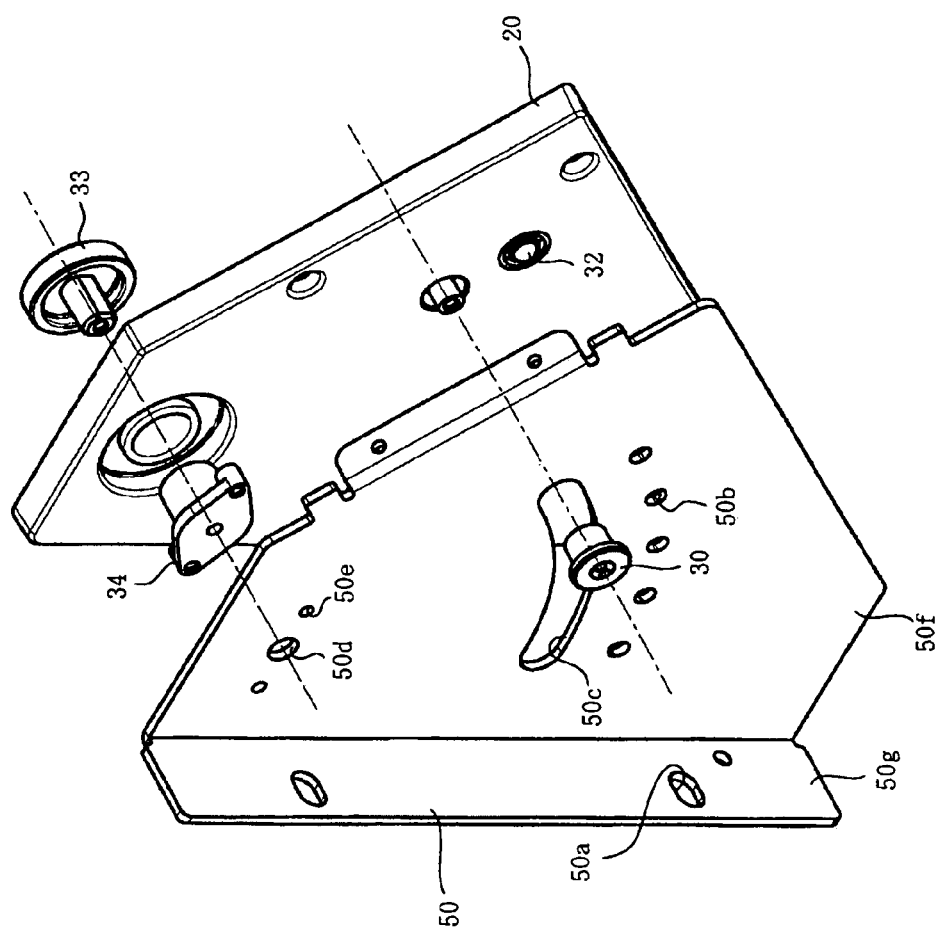
FIG. 4 is a drawing of a side plate that shows the condition in which the sound module is pivoted and set.

FIG. 3(b) is a cross-section drawing along the line A-A shown in FIG. 3(a). FIG. 4 is an oblique exploded drawing of the angle member 50.

Five threaded holes 20a are positioned on the side plate 20, and the side plate is screwed onto the main body 10 through these threaded holes. A first shaft 33 and a second shaft 34, which are located near the front surface of the side plate 20, are mounted in locations that correspond to the upper portion of the front surface, and are mounted so that rotation is possible with respect to the side plates 20. In one embodiment of the present invention, the first shaft 33 and the second shaft 34 are formed using resin. There is a protrusion on the first shaft 33, which has the shape of a cylinder with flat surfaces on both sides. There is a concavity on the inside of the second shaft 34 that mates with the protrusion of the first shaft. Hence a shaft is formed which has an outside diameter that mates with the shaft hole formed on the side plate 20.

The side plate 20 is held between the first shaft 33 and the second shaft 34. The first shaft 33 and the second shaft 34 are fastened together to become a single unit by a tapping screw from the second shaft 34 side so that rotation is possible with respect to the side plate 20. Tapping screws are also inserted into the two screw holes 50e on the angle member 50 and the angle member 50 is fastened to the second shaft. The hole 50d between the two screw holes 50e allows adjustment to the tightness the tapping screw to be made after the assembly of the first shaft 33, the second shaft 34, and the angle member 50, so that the first shaft 33 and the second shaft 34 pivot smoothly.

The ball plunger 32 is positioned on the side plate 20. The support holes 50b are placed in five locations on the angle member 50 along an arc with the pivot shaft as the center. The mating of the plunger 32 and the support holes 50b allows the sound source module 1 to be maintained at a specific slant angle when the sound source module 1 is attached to the rack. As shown in the cross-section drawing of FIG. 3(b), the ball plunger 32 is formed in a cylindrical shape with the threads 32c on the outside surface and is screwed into the female threads on the side plate 20. The ball plunger further comprises a steel ball 32a and a compressed coil spring 32b inside the cylinder. The compressed coil spring 32b impels the ball 32a so as to push the ball toward the outside.

Because the compressed coil spring 32b pushes the ball 32a toward the outside, when the ball 32a is mated with any of the support holes 50b on the side plate 20, the sound source module 1 can be maintained at that angle. When forces are applied to the handles 25 of the operating panel 11 to change the slant angle of the sound source module 1, the ball 32a is pushed toward the inside against the resistance of the compressed coil spring 32b, hence enabling a change of the slant angle.

The oval guide hole 50c is formed on the angle member 50 in an arc with the pivot shaft as the center and in the long direction such that it is possible for the sound source module 1 to pivot approximately 45 degrees. A guide member 30 with a holding section wider than the guide hole 50c is placed on the side plate 20 such that the angle member 50 will not be spread outward, even though the angle member 50 is pressed by the compressed coil spring 32b.

Figure 5:
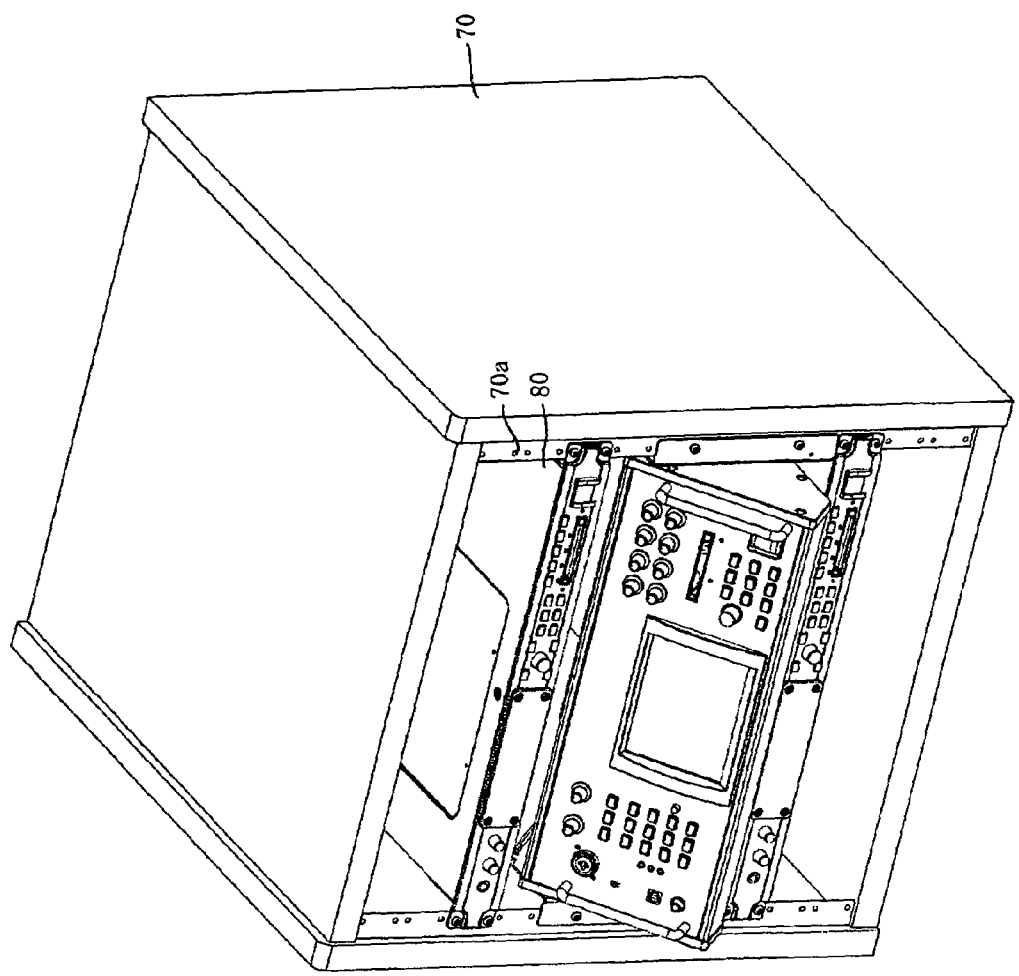
FIG. 5 is an oblique view drawing that shows the sound source module mounted in a rack.

FIG. 5 is a drawing that shows the state in which the sound source module 1 is mounted in the rack 70 as described above. In this embodiment, the rack 70 is a 19 inch rack that complies with the EIA standards and comprises vertical pillars inside the rack 70 on both sides. The pillars comprise a large number of female threads for fastening electronic devices. The female threads are spaced at a pitch such that it is possible to mount electronic devices having a height of 1 U or multiples of 1 U.

In this embodiment, the operating panel of the sound source module 1 has a height of 4 U. In order to allow the panel to slant at an angle such as in FIG. 5, it is necessary to leave the space of 1 U above the sound source module 1 empty, but there is no need to leave empty space below this position. Other embodiments of the present invention may have different sizes or use racks with different dimensions.

Figure 6C:
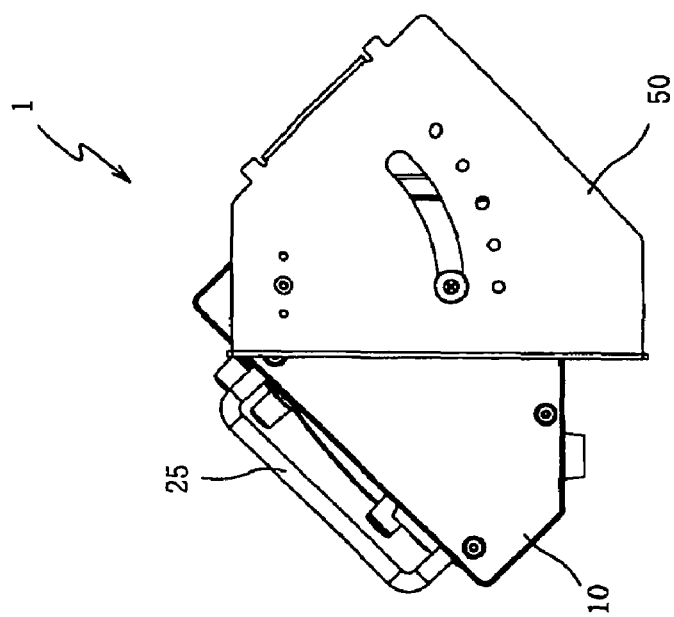
FIGS. 6(b) and 6(c) are side surface drawings that show the condition when the operating panel is set slanted at specific angles.
Figure 6B:
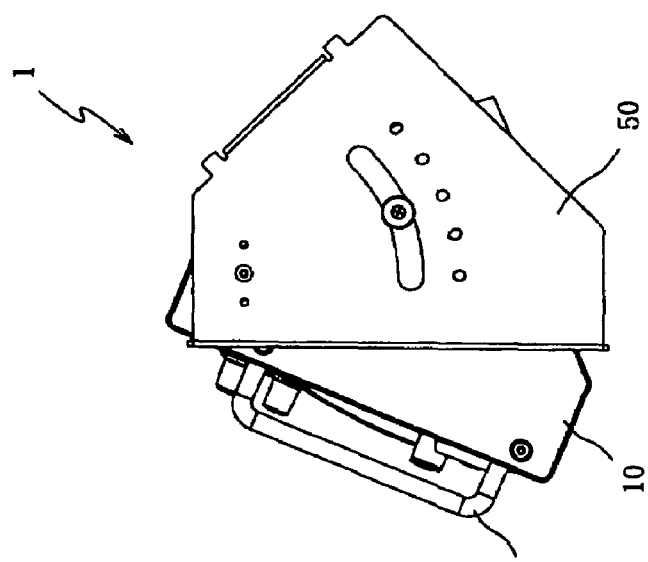
Figure 6A:
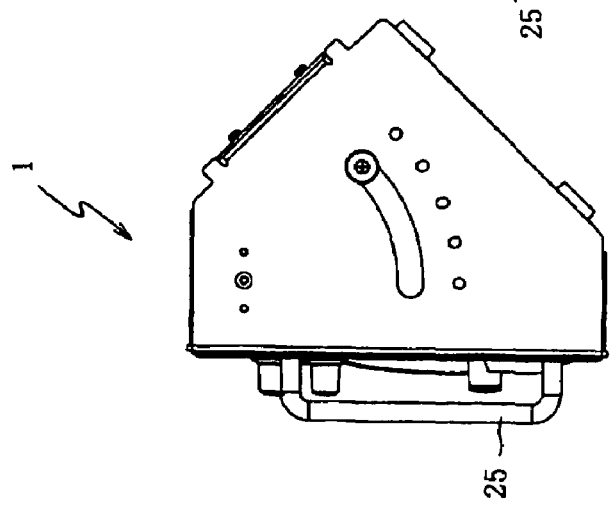
FIG. 6(a) is a side surface drawing that shows the sound source module set such that the operating panel is vertical.

FIG. 6 is a drawing that shows the side surface in those cases where the sound source module 1 is fixed at a slant. FIG. 6(a) shows the case where the operating panel 11 is set so that the panel is vertical. FIG. 6(b) shows the case where the operating panel 11 is set at a 22.5 degree slant from the vertical direction. FIG. 6(c) shows the case where the operating panel is set at a 45 degree slant from the vertical direction. As shown in FIG. 6(a), when the operating panel is set so that the panel is vertical, neither the upper portion nor the lower portion of the main body 10 protrudes into the space above or below the main body. As shown in FIGS. 6(b) and 6(c), when the operating panel is set at a slant, the upper portion of the main body 10 protrudes into the space above the main body 10 but the lower portion does not protrude into the space below.

As discussed above, when the electronic device of the present invention is mounted in a rack, the electronic device can be set at any desired angle. Hence it is possible to set the operators on the operating panel in a position where the operators can be easily accessible. In addition, since the operating panel further comprises a liquid crystal display screen, it is possible to set the liquid crystal display screen at an angle where viewing is easy.

In addition, since the axis of rotation of the electronic device is positioned near the upper portion the operating panel, when the electronic device is rotated, the lower edge of the operating panel is lifted up toward the front. Accordingly, the operating panel becomes easy to see and the operators become easy to operate.

An explanation was given above concerning one preferred embodiment of the present invention when applied to a sound source module. However, the present invention is in no way limited to the preferred embodiment described above. Various modifications and changes that do not deviate from and are within the scope of the essentials of the present invention can be easily surmised.

For example, in the preferred embodiment described above, the electronic device in accordance with the present invention is a sound source module, but the present invention may also be applied to a sound effect apparatus, a recorder, a karaoke apparatus, or various other electronic devices.

In addition, in the preferred embodiment described above, the pivot shafts are placed independently on the side plates 20. However, other embodiments of the present invention may have configurations such that a pivot shaft passes through the main body 10 and operates together with the left and right angle members.

In addition, in the preferred embodiment described above, the side plates 20 are furnished with the ball plungers 32 and the configuration is such that the sound source module 1 is maintained at a specific angle by the insertion of the balls 32a into the support holes 50b on the angle members 50. However, other embodiments of the present invention may have configurations such that rotation is made in one direction with a ratchet and rotation in the other direction is prevented using teeth that have been cut at specific angles.

What is claimed is:

1. An electronic device that can be mounted in a rack and comprising:
   a main body,
   an operating panel on a front surface of the main body, said operating panel comprising a plurality of operators,
   a pivot shaft on a side surface of the main body, wherein said side surface is perpendicular to the operating panel,
   a support device that supports the electronic device at a specified pivoting position, and
   an angle member comprising a rack fastening section fastened to the rack, a pivot shaft fastening section fastened to the pivot shaft, and a holding section that supports the support device;
   wherein the support device comprises a fastening portion that fastens in three or more pivot positions; and
   wherein the support device further comprises a ball plunger, and wherein the holding section comprises a plurality of support holes that are formed on the angle member along an arc of a circle with the pivot shaft at center of the circle.

2. The electronic device according to claim 1, wherein the pivot shaft is positioned in the vicinity of an upper part of the operating panel.

3. The electronic device according to claim 2, wherein the support device comprises a fastening portion that fastens in three or more pivot positions.

4. An electronic device that can be mounted in a rack and comprising:
   a main body,
   an operating panel on a front surface of the main body, said operating panel comprising a plurality of operators,
   a pivot shaft on a side surface of the main body, wherein said side surface is perpendicular to the operating panel,
   a support device that supports the electronic device at a specified pivoting position, and
   an angle member comprising a rack fastening section fastened to the rack, a pivot shaft fastening section fastened to the pivot shaft, and a holding section that supports the support device;
   wherein the main body is in the shape of a pentagonal prism, and wherein the main body further comprises a side plate in a pentagonal shape.

5. The electronic device according to claim 1 wherein the operating panel further comprises a liquid crystal display.

6. The electronic device according to claim 1,
   wherein the holding section comprises a plurality of support holes, and
   wherein the operating panel can be adjusted to have different slant angles with respect to the rack depending on which support hole the support device is supported by.

7. A pivotal mounting structure for an electronic device comprising:
   a side plate attached to a side surface of a main body of the electronic device, wherein the side plate comprises a support device,
   a pivot shaft attached to the side plate such that the rotation of the shaft is possible, and
   an angle member attached to the pivot shaft, wherein the angle member comprises a holding section and a rack fastening section that can be fastened to a rack,
   wherein the angle member may rotate with respect to the side plate around the pivot shaft, and
   wherein a slant angle between the side plate and the angle member may be maintained when the support device is supported by the holding section.

8. The pivotal mounting structure according to claim 7,
   wherein the main body comprises an operating panel on a front surface,
   wherein the holding section comprises two or more support holes where the support device can be supported, and
   wherein when the angle member is attached to the rack via the rack fastening section, the main body may pivot around the shaft to maintain at two or more slant angles with respect to the rack corresponding to the two or more support holes where the support device supports the holding section.

9. The pivot mounting structure according to claim 8, wherein the operating panel comprises a plurality of operators and switches.

10. The pivot mounting structure according to claim 8, wherein the operating panel comprises a liquid crystal display.

11. The pivot mounting structure according to claim 7, wherein the side plate further comprises a guide member, wherein the angle member further comprises a guide hole shaped in an arc with the pivot shaft as the center, and wherein the guide member fits into the guide hole so that the guide hole restricts the amount of rotation between the side plate and the angle member.

12. The pivot mounting structure according to claim 7, wherein the support device comprises a ball plunger, and wherein the holding section comprises a plurality of holes along an arc with the pivot shaft as the center.

13. The pivot mounting structure according to claim 7, wherein the pivot shaft is located near a top of the side plate close to a front surface of the electronic device.

14. The pivot mounting structure according to claim 7, wherein the side plate and the angle member both have pentagonal shapes.

15. The pivot mounting structure according to claim 13, wherein the side plate and angle member both have pentagonal shapes such that when the main body rotates upward against the angle member, said main body protrudes into a space above, but not a space below.

16. A method of mounting an electronic device on a rack, wherein the electronic device comprises a main body, comprising the steps of:
    attaching a side plate to a side surface of the main body, wherein the side plate comprises a support device,
    attaching a pivot shaft to the side plate such that the rotation of the shaft is possible,
    attaching an angle member to the pivot shaft, wherein the angle member comprises a holding section and a rack fastening section, and
    fastening the rack fastening section on a rack,
    wherein the angle member may rotate with respect to the side plate around the pivot shaft, and
    wherein a slant angle between the side plate and the angle member may be maintained by supporting the support device with the holding section.

17. The method of mounting an electronic device according to claim 16, further comprising the steps of:
    forming two or more support holes on the angle member as the holding section for supporting the support device,
    wherein the main body of the electronic device may pivot around the shaft at two or more angles with respect to the rack corresponding to the two or more locations where the support device supports the holding section.

18. The method of mounting an electronic device according to claim 16, wherein a plurality of operators and switches are formed on an operating panel on a front surface of the main body.

19. The method of mounting an electronic device according to claim 16, wherein a liquid crystal display is formed on an operating panel on a front surface of the main body.

20. The method of mounting an electronic device according to claim 16, further comprising the steps of:
   forming a guide member on the side plate,
   forming a guide hole on the angle member shaped in an arc with the pivot shaft at center, and
   placing the guide member into the guide hole so that the guide hole restricts the amount of rotation between the side plate and the angle member.

21. The method of mounting an electronic device according to claim 16, further comprising the steps of:
   forming a ball plunger for the support device,
   forming a plurality of support holes for the holding section, wherein the support holes are along an arc of a circle with the pivot shaft at center of the circle.

22. The method of mounting an electronic device according to claim 16, further comprising the step of placing the pivot shaft near a top of the side plate close to a front surface of the electronic device.

23. The method of mounting an electronic device according to claim 16, further comprising the step of forming the side plate and the angle member in a pentagonal shape.

24. The method of mounting an electronic device according to claim 22, further comprising the step of forming the side plate and the angle member in a pentagonal shape such that when the main body rotates upward against the angle member, said main body protrudes into a space above, but not a space below.

* * * * *